(12) United States Patent
Spirito et al.

(10) Patent No.: US 11,754,608 B2
(45) Date of Patent: Sep. 12, 2023

(54) MEASUREMENT ARRANGEMENT FOR LOAD PULL MEASUREMENTS COMPRISING A MULTIPLIER BASED ACTIVE TUNER

(71) Applicant: Technische Universiteit Delft, Delft (NL)

(72) Inventors: Marco Spirito, Delft (NL); Luca Galatro, Delft (NL); Carmine De Martino, Delft (NL)

(73) Assignee: Vertigo Technologies B.V., Delft (NL)

( * ) Notice: Subject to any disclaimer, the term of this patent is extended or adjusted under 35 U.S.C. 154(b) by 84 days.

(21) Appl. No.: 17/414,341

(22) PCT Filed: Dec. 18, 2019

(86) PCT No.: PCT/NL2019/050854
§ 371 (c)(1),
(2) Date: Jun. 16, 2021

(87) PCT Pub. No.: WO2020/130820
PCT Pub. Date: Jun. 25, 2020

(65) Prior Publication Data
US 2022/0057441 A1 Feb. 24, 2022

(30) Foreign Application Priority Data
Dec. 20, 2018 (NL) .................................. 2022256

(51) Int. Cl.
*G01R 27/32* (2006.01)
*G01R 31/28* (2006.01)

(52) U.S. Cl.
CPC ......... *G01R 27/32* (2013.01); *G01R 31/2822* (2013.01)

(58) Field of Classification Search
CPC .... G01R 31/2822; G01R 27/28; G01R 27/32; G01R 35/005; G01R 27/04;
(Continued)

(56) References Cited

U.S. PATENT DOCUMENTS 6,297,649 B1 * 10/2001 Tsironis .................. H01P 1/212
333/248
7,449,893 B1 * 11/2008 Tsironis .................. G01R 27/32
324/636
(Continued)

FOREIGN PATENT DOCUMENTS

DE 10 2004 049 421 A1 6/2006
GB 2404257 A 1/2005
(Continued)

OTHER PUBLICATIONS

Visweswaran et al: "An IQ-Steering Technique for Amplitude and Phase Control of mm-Wave Signals", 2015, 86th ARFTG Microwave Measurement Conference, IEEE, Dec. 3, 2015 (Dec. 3, 2015), pp. 1-4, XP032849336, DOI: 10.1109/ARFTG.2015.7381471.
(Continued)

*Primary Examiner* — Vinh P Nguyen
(74) *Attorney, Agent, or Firm* — N.V. Nederlandsch Octrooibureau

(57) ABSTRACT

Load pull measurement arrangement having an active tuner with a signal generator providing a signal at a first frequency to a vector modulator. The vector modulator has an input for receiving control signals and is arranged to provide an injection signal at the first frequency based on the control signals. The active tuner further has a frequency multiplier receiving the injection signal and outputting a multiplied injection signal having a second frequency, the second frequency being an integer multiple of the first frequency. Furthermore, a millimeter wave extender has a frequency
(Continued)

multiplier in the signal injection path connected to the device under test during operation.

10 Claims, 4 Drawing Sheets

(58) Field of Classification Search
CPC ............ G01R 31/2837; G01R 31/2839; G01R 31/31709; G01R 31/31937; G01R 31/2603; G01R 1/06766; G01R 1/073; G01R 1/20; G01R 1/30; G01R 29/0871; H04B 17/21; H04B 1/10; H04B 17/345; H04B 1/69; H04B 17/101; H04B 17/11; H01P 1/212; H04L 1/0057; H04L 1/0071; H04L 27/3416; H04L 27/3488; H04L 27/36; G06F 17/18
See application file for complete search history.

(56) References Cited

U.S. PATENT DOCUMENTS

| | | | | |
|---|---|---|---|---|
| 8,456,175 | B2 * | 6/2013 | Marchetti | G01R 31/2822 324/76.19 |
| 9,214,718 | B2 * | 12/2015 | Mow | H04B 17/12 |
| 11,041,882 | B1 * | 6/2021 | Tsironis | G01R 1/073 |
| 11,137,430 | B1 * | 10/2021 | Tsironis | G01R 27/06 |
| 11,199,568 | B2 * | 12/2021 | Esposito | G01R 31/31937 |
| 2012/0161784 | A1 * | 6/2012 | Benedikt | G01R 31/2837 324/612 |

FOREIGN PATENT DOCUMENTS

| | | |
|---|---|---|
| WO | 2009/131444 A1 | 10/2009 |
| WO | 2010/139968 A1 | 12/2010 |

OTHER PUBLICATIONS

Keysight Technologies et al: "mm-Wave Frequency Extension for Vector Network Analyzers", Apr. 17, 2015 (Apr. 17, 2015), XP055623886, Retrieved from the Internet: URL:https://literature.cdn.keysight.com/litweb/pdf/5990-9610EN.pdf?id=2166536 [retrieved on Sep. 19, 2019].

Marchetti et al: "Active Harmonic Load-Pull With Realistic Wideband Communications Signals", IEEE Transactions On Microwave Theory and Techniques, vol. 56, No. 12, Dec. 2008, pp. 2979-2988, XP011238478, ISSN: 0018-9480, DOI: 10.1109/TMTT.2008.2007330. Section III. Hardware design Section VI. Measurement results.

* cited by examiner

MEASUREMENT ARRANGEMENT FOR LOAD PULL MEASUREMENTS COMPRISING A MULTIPLIER BASED ACTIVE TUNER

FIELD OF THE INVENTION

The present invention relates to a measurement arrangement for load pull measurements of a device under test (DUT), comprising a vector network analyser (VNA) providing a first frequency signal and a local oscillator signal, and arranged to receive measurement signals. An even further aspect of the present invention relates to a millimeter wave extender having a test port for connection to a device under test in a measurement arrangement.

BACKGROUND ART

International patent publication WO2009/131444 discloses an open loop load pull arrangement with determination of injections signals for active load pull measurements of a device under test. A wideband analog-to-digital conversion block is provided for obtaining measurement data. First and second injection signal generators are connected to a source side and a load side of the device under test. This set up allows to create predetermined reflection coefficients at reference planes of the device under test. Injection signal parameters as determined are converted into the injection signals at the source and load side by digital-to-analog conversion. In this measurement arrangement the control and the injection occur at the same frequency (f0 or N*f0 in case harmonic control is performed).

International patent publication WO2010/139968 discloses a measurement system and method for analysing, and characterising, the behaviour of a (high frequency) device under test (or DUT) at relatively high power levels. Such devices may for example need to be analysed when designing devices or designing circuits utilising such devices, for use in high power (large signal) high frequency amplifiers, such as an amplifier for use in a mobile telephone network or other telecommunications-related base-station. The measurement apparatus for measuring the response of an electronic device to a high frequency input signal includes an active load-pull circuit connectable in use to an electronic device to be measured. In this measurement system the control and the injection also happen at the same frequency (f0 or N*f0 in case harmonic control is performed).

In the article entitled "An IQ-steering technique for amplitude and phase control of mm-wave signals" by A. Visweswaran et al. a system is disclosed capable of delivering signals with amplitude and phase control to an on-wafer environment. The system setup employs direct IQ up-conversion in the 7.5-10 GHz band, using a single frequency source (LO) and a power divider. High resolution DACs are used in each IQ modulator to modulate both amplitude and phases of the 'n' coherent LO signals (four shown in the example). Signal amplification followed by frequency multiplication generates mm-wave signals in the 30-40 GHz range.

In the article entitled "Active Harmonic Load-Pull With Realistic Wideband Communications Signals" by Mauro Marchetti a wideband open-loop active harmonic load-pull easement method is disclosed. A single local oscillator is used that generates high frequency signals at fundamental and harmonic frequencies by means of a multiplier for each harmonic.

SUMMARY OF THE INVENTION

The present invention seeks to provide an improved measurement arrangement and components thereof, allowing to perform large signal characterisation of a device under test in frequency ranges not reachable in present day measurement arrangements.

According to the present invention, a measurement arrangement as defined above is provided, having a first active tuner connected on a source side of the device under test to provide a source injection signal to the device under test, and/or a second active tuner connected on a load side of the device under test to provide a load injection signal to the device under test, wherein the first and/or second active tuner is an active tuner comprising a signal generator providing a signal at a first frequency to a vector modulator, the vector modulator having an input for receiving control signals, and being arranged to provide an injection signal at the first frequency based on the control signals, the active tuner further comprising a frequency multiplier receiving the injection signal and outputting a multiplied injection signal having a second frequency, the second frequency being an integer multiple (N) of the first frequency. This allows to provide a large signal device under test characterisation using less expensive components in the measurement arrangement, and allows a device under test characterization at much higher frequencies as those of the phase and amplitude controlling components used in the active tuner itself.

Also, a millimeter wave extender is provided in accordance with an even further aspect of the present invention, the millimeter wave extender comprising a frequency multiplier in the signal injection path connected to the device under test during operation, the frequency multiplier being arranged to output a multiplied injection signal having a second frequency being an integer multiple of a first frequency. Such a millimeter wave extender can be advantageously used as one of the accessories of a vector network analyser.

SHORT DESCRIPTION OF DRAWINGS

The present invention will be discussed in more detail below, with reference to the attached drawings, in which FIG. 1 shows a block diagram of an active tuner according to an embodiment of the present invention;

DESCRIPTION OF EMBODIMENTS

The present invention embodiments relate to an open loop active load pull measurement method and arrangement for millimeter wave frequencies, featuring a hardware implementation coupled with a software control.

Figure 1:
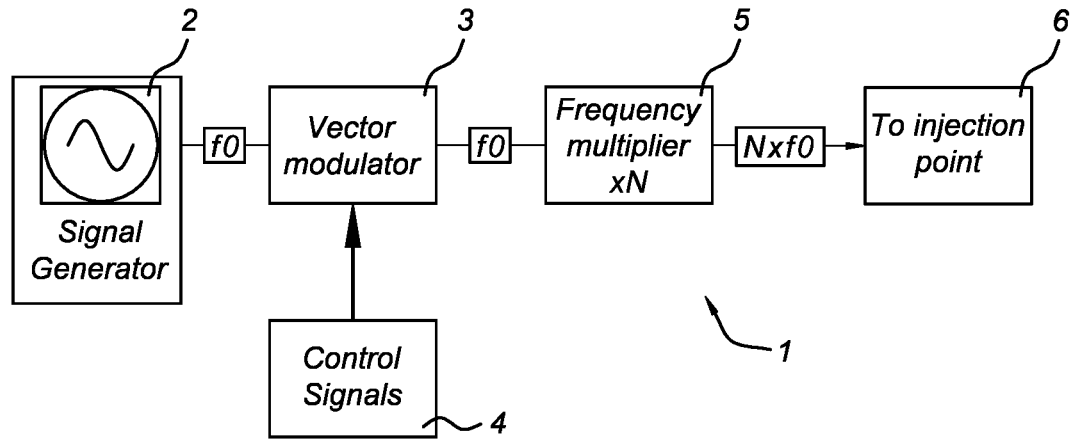

FIG. 1 shows a block diagram of a (multiplied) active tuner 1 according to an embodiment of the present invention.

A signal generator 2 (e.g. a synthesizer or an arbitrary wave generator) provides an initial signal to a vector modulator 3, which receives control signals 4 in order to provide an injection signal at its output, with a first frequency f0. In accordance with the present invention embodiments, the injection signal is multiplied by frequency multiplier 5, to provide at its output a multiplied injection signal at a second frequency N×f0, N being an integer (higher than one). This allows to provide the multiplied injection signal to an injection point 6 at a device under test 7 (see below), while many components of the (multiplied) active tuner 1 operate at a (much lower) frequency f0.

Thus, in a first aspect of the present invention, an active tuner 1 is provided for use in a load pull measurement arrangement, comprising a signal generator 2 providing a signal at a first frequency f0 to a vector modulator 3, the vector modulator 3 having an input for receiving control signals 4, and being arranged to provide an injection signal at the first frequency f0 based on the control signals 4, the (multiplied) active tuner 1 further comprising a frequency multiplier 5 receiving the injection signal and outputting a multiplied injection signal having a second frequency N×f0, the second frequency N×f0 being an integer multiple N of the first frequency f0. Due to the presence of the frequency multiplier 5 between a control point (i.e. control input to signal generator 2 and vector modulator 3) and the injection point (at the reference plane of the device under test 7), the control frequency and injection frequency actually differ and allow device characterization at much higher frequencies as those of the phase and amplitude controlling components used in the active tuner 1.

Figure 2:
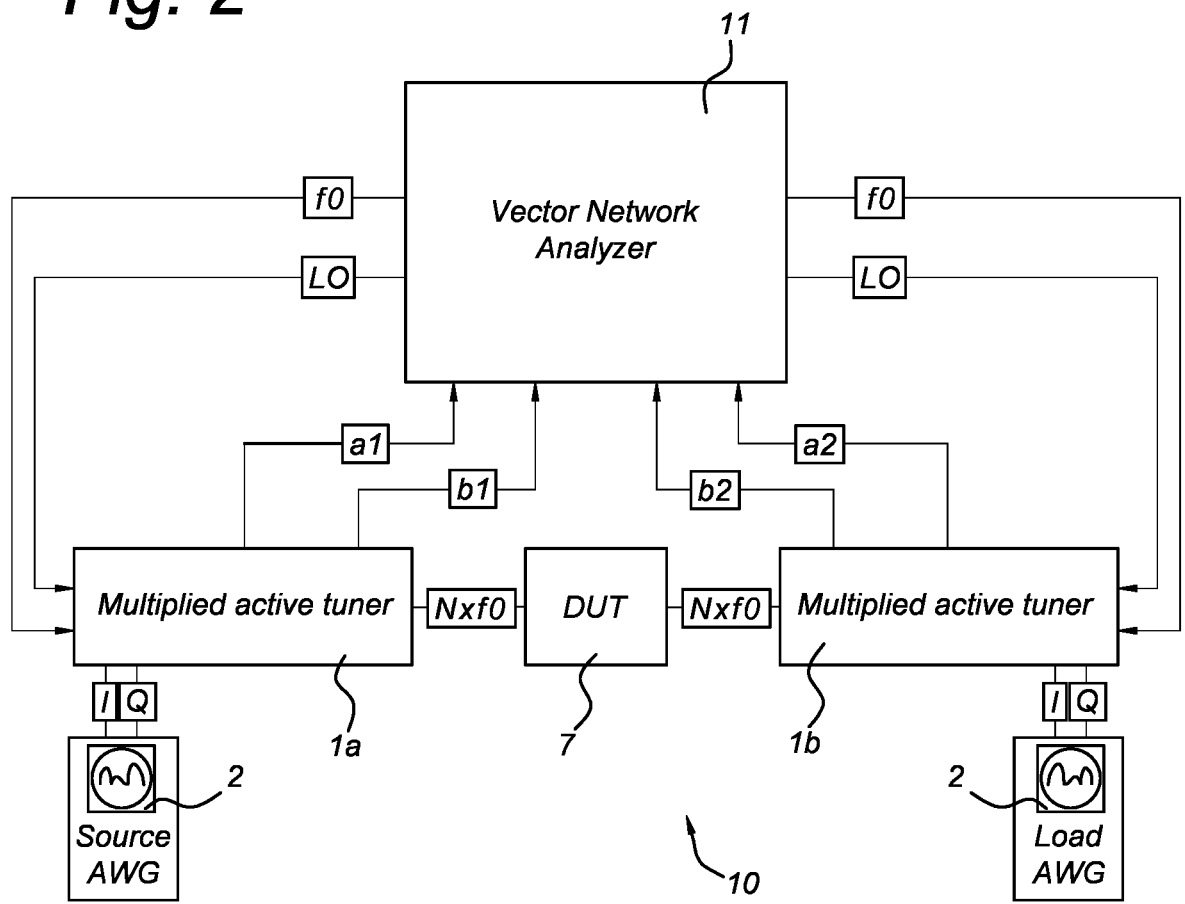
FIG. 2 shows a schematic block diagram of a measurement arrangement employing two (multiplied) active tuners, in accordance with a further embodiment of the present invention.

FIG. 2 shows a schematic block diagram of a measurement arrangement 10 employing two (multiplied) active tuners, in accordance with a further embodiment of the present invention. I.e. in a further aspect of the present invention, a measurement arrangement 10 for load pull measurements of a device under test 7 is provided, comprising a vector network analyser (VNA) 11 providing a first frequency signal f0 and a local oscillator signal LO, and arranged to receive measurement signals a1, b1, b2, a2, a first active tuner 1*a* connected on a source side of the device under test 7 to provide a source injection signal to the device under test 7, and/or a second active tuner 1*b* connected on a load side of the device under test 7 to provide a load injection signal to the device under test 7, wherein the first and/or second (multiplied) active tuner 1*a*, 1*b* is an active tuner 1 according to one of the present invention embodiments.

A possible application of the active tuner 1 described above, involves a Vector Network Analyzer (VNA) 11 being employed for the signal generation. The source/load side multiplied active tuner 1*a*, 1*b* takes as input an f0 signal generated by the VNA 11 frequency synthesizer, a local oscillator (LO) signal also generated by a VNA 11 internal (or external) synthesizer, and a set of baseband I and Q signals, generated by an arbitrary waveform generator (AWG) 2, for both source and load side. The source/load side multiplied active tuner 1*a*, 1*b* delivers to the DUT 7 an injection signal at a frequency N×f0, where N is the multiplication factor specific for the employed active tuner 1*a*, 1*b*. The a1, b1, b2, a2 waves are separated by the tuner 1*a*, 1*b*, e.g. by means of an internal reflectometer, and downconverted with e.g. internal mixers using the LO frequency provided by the VNA 11, or by an external synthesizer. The a1, b1, a2, b2 waves are acquired by means of the VNA 11 internal receivers.

Figure 3:
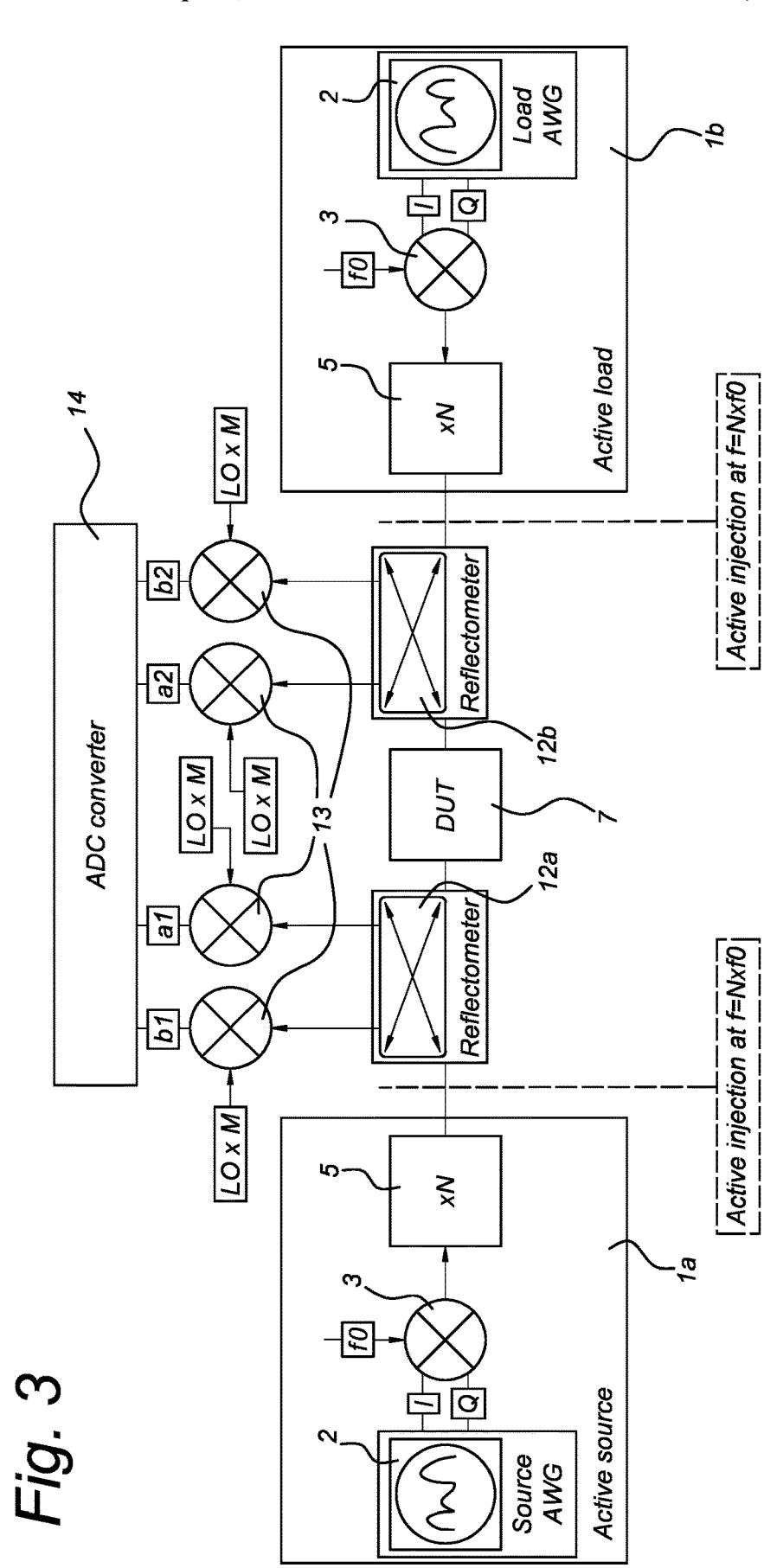
FIG. 3 shows a block diagram of an embodiment of a measurement arrangement in accordance with the present invention.

FIG. 3 shows a block diagram of a further embodiment of a measurement arrangement in accordance with the present invention, with a more general and detailed implementation of a load pull measurement setup realized by using the present invention (multiplied) active tuner 1*a*, 1*b* embodiments. The signal injection, for both source and load loop, is realized by means of an IQ mixer 3, which input is driven by a signal at frequency f0, and the I and Q inputs are provided by means of an AWG 2. I and Q are provided as DC signals for each f0, so that the signal at the output of the IQ mixer 3 is at frequency 10. This signal is provided at the input of the frequency multiplier 5 with a general multiplication factor N, so that its output signal, which represents the injection signal, is at a frequency N×f0. It is noted that an AWG 2 may be implemented in many ways, as such known to the skilled person, e.g. a digital-to-analog converter (DAC) may be used, programmed to provide different signals. Alternatively a precision DC source is used. Close to the DUT 7, reflectometers 12*a*, 12*b* provide the proper wave separation, and the scattered waves a1, b1, a2, b2 are then down converted using down conversion mixers 13 (and the provided LO×M (M≥1) signal) and acquired by means of an ADC converter 14. The analog-to-digital converter 14 is arranged for digitizing the source and/or load injected and reflected signals (a1, b1, a2, b2) in a further embodiment. Signal amplification can optionally be performed by means of a power amplifier (not shown) at the input and/or the output side of the frequency multiplier 5, in order to optimize the measurement dynamic range.

In a further embodiment of the present invention, the measurement arrangement 10 further comprises a source and/or load reflectometer 12*a*, 12*b* connected to a signal line between the device under test 7 and the first and/or second active tuner 1*a*, 1*b*, respectively, and providing source and/or load injected and reflected wave signals a1, b1, a2, b2. Note that this embodiment is thus operative at the N×f0 (second) frequency from the viewpoint of the device under test 7. The down conversion mixer 13 receiving the local oscillator signal (LO×M (M≥1)) may be implemented differently, i.e. using a more generic type of down conversion unit 13.

Figure 4:
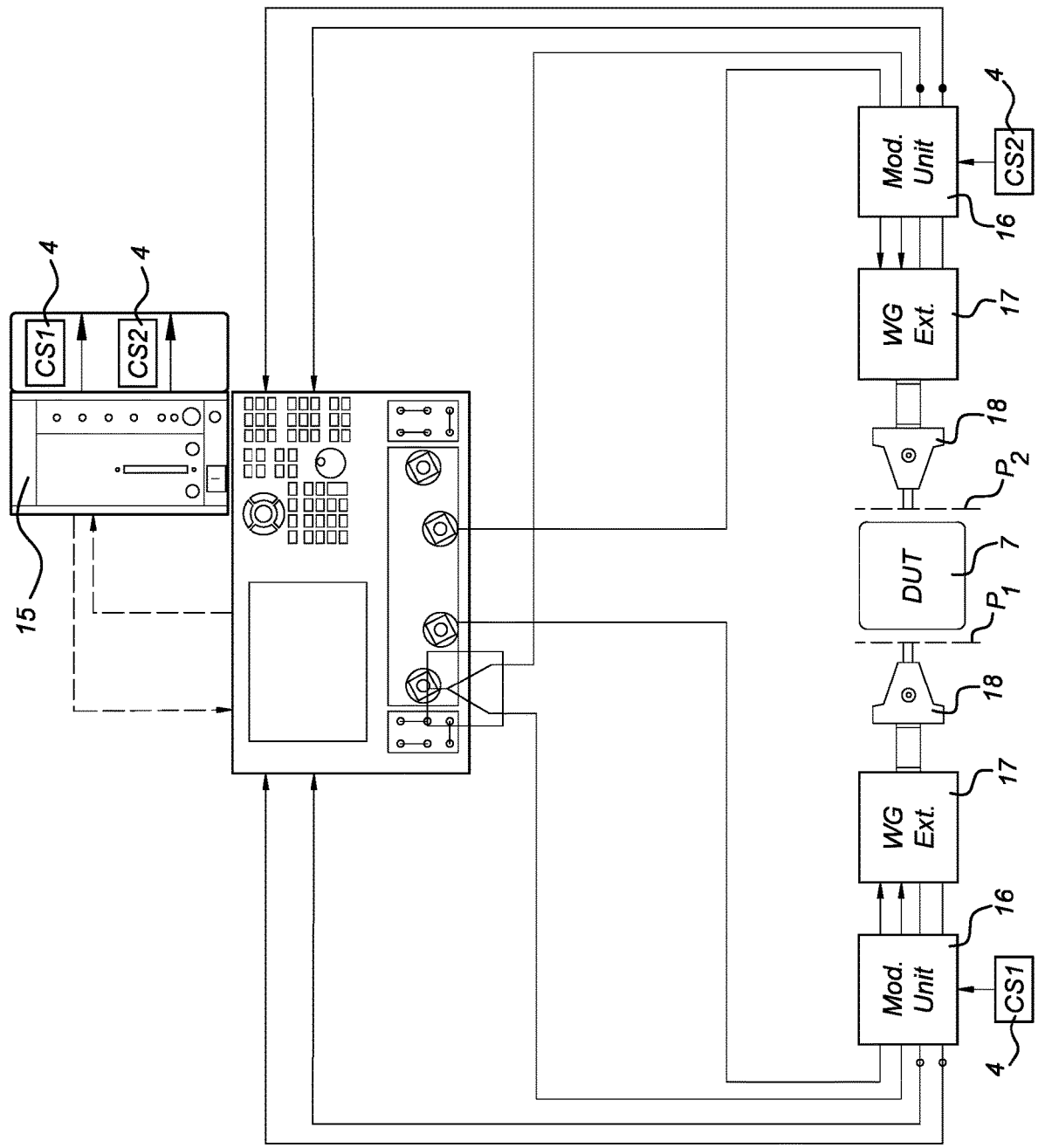
FIG. 4 shows a schematic block diagram of a measurement arrangement according to a further embodiment of the present invention.

In a further possible implementation of the present measurement arrangement, millimeter wave extenders 17 are employed for the combination of frequency multiplication, amplification and wave separation, as shown in the exemplary embodiment of the measurement arrangement 10 shown in FIG. 4. This alternative measurement arrangement 10 includes a VNA 11 (with an arbitrary wave generator (AWG) 15 (which, similar to the AWG 2 described above, may be implemented as a programmed DAC or precision DC source)), in a similar set-up to the embodiment shown in FIG. 2, but the stages contacting the device under test 7 are specifically adapted for high frequency and high power measurements. For this, millimeter wave (mm-wave) extenders 17 are applied at the source and/or load side of the device under test 7, respectively, connected to respective modulation units 16. The millimeter wave extenders 17 comprise a test port 18 (acting as waveguide or wafer probe extension), which in fact extends the measurements reference planes P1, P2 as close to the device under test 7 as possible. In this invention embodiment, the millimeter wave extender 17 combines the frequency multiplier 5 and reflectometer 12*a*; 12*b* of the measurement arrangement 10 as shown in FIG. 3, while the modulation units 16 includes the functional blocks similar to the signal generator 2 and vector modulator/IQ mixer 3. Thus, in a further embodiment, the frequency multiplier 5 is comprised in a millimeter wave extender 17. Moreover, in a further aspect, the present invention relates to a millimeter wave extender having a test port 18 for connection to a device under test (7) in a measurement arrangement 10 as described herein. The millimeter wave extender 17 comprises a frequency multiplier 5 in the signal injection path connected to the device under test 7 during operation, the frequency multiplier 5 being arranged to output a multiplied injection signal having a second frequency N×f0 being an integer multiple N of a first frequency f0. Such a millimeter wave extender 17 can be advantageously used as one of the accessories of a VNA 11.

Figure 5:
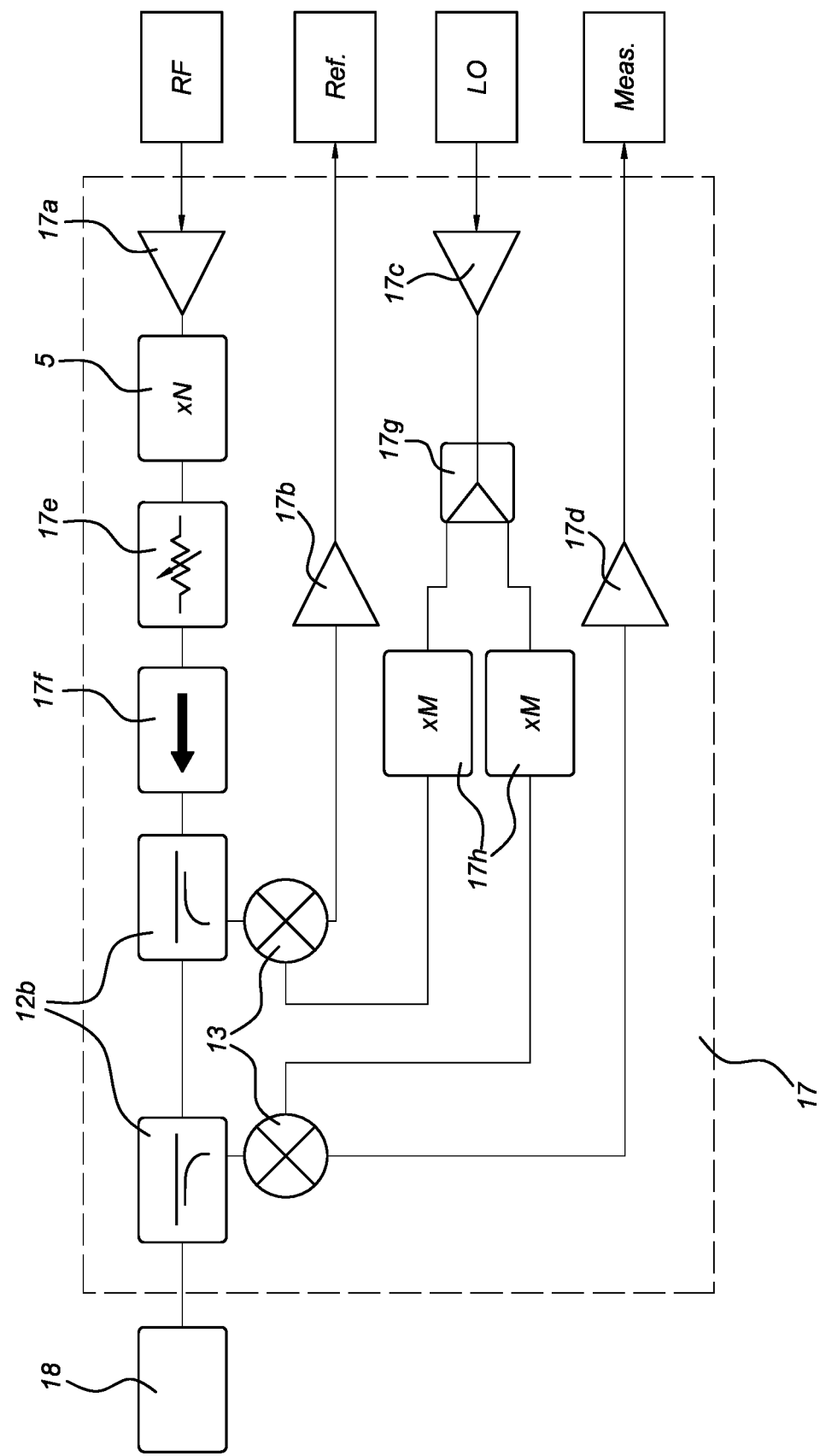
FIG. 5 shows a block diagram of a millimeter wave extender used in the measurement arrangement of FIG. 4.

A more detailed block diagram of an exemplary embodiment of a millimeter wave extender 17 is shown in FIG. 5 (for the load-side in the measurement arrangement of FIG. 4). On the right side, the inputs and outputs with the modulation unit 16 are shown, and on the left side the connection to the device under test 7 at the reference plane P2. In the millimeter wave extender 17, similar components are provided as described with reference to the FIG. 3 embodiment, i.e. reflectometer 12b and down conversion mixers 13, as well as the frequency multiplier 5. For each input/output of the millimeter wave extender 17, amplifiers/buffers 17a-17d are provided, as well as additional components: in the RF pathway, between frequency multiplier 5 and reflectometer 12b, a variable attenuator 17e is optionally provided, and an optional isolator 17f. In the LO pathway, a splitter 17g is present, followed by two multipliers 17h (with a multiplication factor M, M≥1). These millimeter wave extenders 17 are suited to perform transmit/receive conversions for S-parameter measurements of a device under test 7. In an alternative embodiment, instead of the splitter 17g and subsequent multipliers 17h, a sequence of a primary multiplier, (power) splitter 17g and two secondary multipliers (one in each branch of the splitter 17g is used.

In a further aspect, the present invention relates to a method for performing measurements on a device under test 7 using a measurement arrangement 10 according to one of the present invention embodiments.

The method embodiments of the present invention are e.g. associated with the use of an active tuner 1 (or similar) as described above for the tuning of load impedance in a measurement arrangement 10, where the signal generation is performed using a frequency synthesizer, while the active injection is realized by means of the vector modulator 3 (e.g. an IQ mixer) and the frequency multiplier 5 to reach the desired (second) measurement frequency N×f0.

In the method embodiments, impedance tuning for the device under test 7 is achieved by means of a convergence algorithm, where the control signals 4 provided to the vector modulator 3 are varied, iteratively, until the injection signal provided at the injection point provides the desired loading condition of the device under test 7.

With these method embodiments it is possible to perform signal generation and modulation at frequencies f0 lower than the actual measurement frequency N×f0, and its novelty allows for active load (and source) pull measurements also at frequencies for which vector modulation is not possible or very expensive (i.e., millimeter and sub-millimeter wave frequency).

In a further embodiment, the method further includes a number of calibration steps. The calibration procedure allows to control power at the input (source) side of the device under test 7, and to measure typical large signal parameters such as Pout, Gain and PAE (power added efficiency).

The calibration procedure comprises several calibration steps, a first one of which is an S-parameter calibration, which is effectuated by connecting terminations (i.e. loads/reflects/thru connections) to a test port of the associated millimeter wave extender 17 at the source and/or load side. Next, a power calibration step is performed, by connecting a power sensor to the test port of the one or two millimeter wave extenders 17 used, allowing to link the absolute power at the test port to the power that can be detected by the VNA 11. In a novel step, a load is connected to each millimeter wave extender 17, to characterize the non-linear response of the millimeter wave extender 17. In an optional further step, an on-wafer calibration step is performed allowing to move the reference planes to probe tips making the actual contact with the device under test 7 during measurements.

The present invention method embodiments, using one of the present invention measurement arrangements 10 are particularly suited for S-parameter characterization of a device under test 7. In practical implementations this can be realized as a software module (e.g. being executed in a processing unit connected to the various components in the measurement arrangement 10), for different measurement applications, such as power controlled S-parameters, large signal measurements, load-pull measurements and mixed frequency (harmonic) measurements. It is noted that the maximum frequency is determined by the millimeter wave extenders 17, which in the present invention embodiments is higher because of the used frequency multipliers 5.

The present invention has been described above with reference to a number of exemplary embodiments as shown in the drawings. Modifications and alternative implementations of some parts or elements are possible, and are included in the scope of protection as defined in the appended claims.

The invention claimed is:

1. A measurement arrangement for load pull measurements of a device under test, comprising
a vector network analyser providing a first frequency signal and a local oscillator signal, and arranged to receive measurement signals, and
a first active tuner, configured to receive the first frequency signal, connected on a source side of the device under test to provide a source injection signal to the device under test, and/or a second active tuner, configured to receive the first frequency signal, connected on a load side of the device under test to provide a load injection signal to the device under test, wherein the first and/or second active tuner is an active tuner comprising a signal generator providing a signal at a same frequency as the frequency of the first frequency signal to a vector modulator, the vector modulator having an input for receiving control signals, wherein the control signal are based on the source injection signal and/or the load injection signal, and being arranged to provide an injection signal at the first frequency based on the control signals,
the active tuner further comprising a frequency multiplier receiving the injection signal and outputting a multiplied injection signal having a second frequency, the second frequency being an integer multiple of the first frequency.

2. The measurement arrangement according to claim 1, wherein the vector modulator is an IQ mixer.

3. The measurement arrangement according to claim 1, wherein the frequency multiplier is comprised in a millimeter wave extender.

4. The measurement arrangement according to claim 1, further comprising a source and/or load reflectometer connected to a signal line between the device under test and the first and/or second active tuner, respectively, and providing source and/or load injected and reflected wave signals.

5. The measurement arrangement according to claim 4, further comprising a down conversion unit for each of the source and/or load injected and reflected wave signals.

6. The measurement arrangement according to claim 5, wherein the down conversion unit is a mixer receiving the local oscillator signal.

7. The measurement arrangement according to claim 4, further comprising an analog-to-digital converter for digitizing the source and/or load injected and reflected signals.

8. A millimeter wave extender for use in the measurement arrangement according to claim 1, having a test port for connection to a device under test in the measurement arrangement, the millimeter wave extender comprising the frequency multiplier in the signal injection path connected to the device under test during operation, the frequency multiplier being arranged to output a multiplied injection signal having a second frequency being an integer multiple of a first frequency.

9. A method for performing measurements on a device under test comprising:
   providing a first frequency signal and a local oscillator signal to a first active tuner and/or a second active tuner;
      wherein the first active tuner is connected on a source side of the device under test and is configured to provide a source injection signal to the device under test,
      wherein the second active tuner is connected on a load side of the device under test and is configured to provide a load injection signal to the device under test,
      generating the source injection signal and/or the load injection signal based on the first frequency signal and/or the local oscillator signal, wherein the source injection signal and/or the load injection signal have a same frequency as the first frequency signal;
      generating control signals based on the source injection signal and/or the load injection signal;
      receiving one or more control signals based on the source injection signal and/or the load injection signal;
      generating an injection signal at the first frequency based on the one or more control signals;
      multiplying the injection signal and generating a multiplied injection signal, wherein the multiplied injection signal has a second frequency that is an integer multiple of the first frequency;
      providing the multiplied signal to the device under test; and
      receiving measurement signals from the first and/or active tuner.

10. The method according to claim 9, further comprising a calibration procedure before actual measurements, the calibration procedure comprising:
   a first calibration step comprising an S-parameter calibration, which is effectuated by connecting terminations to a test port of a millimeter wave extender at the source and/or load side of the device under test, wherein the millimeter wave extender connects to the device under test via the test port, the millimeter wave extender comprising the frequency multiplier in the signal injection path connected to the device under test during operation, the frequency multiplier being arranged to output a multiplied injection signal having a second frequency being an integer multiple of a first frequency;
   a second calibration step comprising detecting an absolute power at the second frequency at the test port of the millimeter wave extender at the source and/or load side of the device under test.

* * * * *